United States Patent
Richardson

(10) Patent No.: US 8,020,078 B2
(45) Date of Patent: *Sep. 13, 2011

(54) METHODS AND APPARATUS FOR REDUCING ERROR FLOORS IN MESSAGE PASSING DECODERS

(75) Inventor: Tom Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 626 days.

This patent is subject to a terminal disclaimer.

(21) Appl. No.: 11/761,358

(22) Filed: Jun. 11, 2007

(65) Prior Publication Data

US 2007/0234184 A1 Oct. 4, 2007

Related U.S. Application Data

(63) Continuation-in-part of application No. 10/892,587, filed on Jul. 16, 2004, now Pat. No. 7,237,181.

(60) Provisional application No. 60/531,808, filed on Dec. 22, 2003.

(51) Int. Cl.
 *H03M 13/00* (2006.01)
(52) U.S. Cl. .................................. 714/780; 714/758
(58) Field of Classification Search .................. 714/758, 714/780
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,157,671 A | 10/1992 | Karplus | |
| 5,271,042 A | 12/1993 | Borth et al. | |
| 5,293,489 A | 3/1994 | Furui et al. | |
| 5,313,609 A | 5/1994 | Baylor et al. | |
| 5,396,518 A | 3/1995 | How | |
| 5,457,704 A | 10/1995 | Hoeher et al. | |
| 5,526,501 A | 6/1996 | Shams | |
| 5,615,298 A | 3/1997 | Chen | |
| 5,671,221 A | 9/1997 | Yang | |
| 5,860,085 A | 1/1999 | Stormon et al. | |
| 5,864,703 A | 1/1999 | van Hook et al. | |
| 5,867,538 A | 2/1999 | Liu | |

(Continued)

OTHER PUBLICATIONS

International Search Report-PCT/US04/042849, International Search Authority-European Patent Office, Jun. 21, 2006.

(Continued)

*Primary Examiner* — M. Mujtaba Chaudry
(74) *Attorney, Agent, or Firm* — Semion Talpalatsky; Michelle Gallardo; Jonathan T. Velasco

(57) ABSTRACT

An iterative message passing decoder, e.g., an LDPC decoder, operating in conjunction with a soft input-soft output signal processing unit, e.g., an ISI detector, has an error floor performance region influenced by the decoder's sub-optimal message passing nature. Error floor reduction is achieved by a simple message re-initialization mechanism. Decoder edge states, e.g., constraint to variable node messages in decoder memory, are reinitialized, e.g., for an iteration, during the decoding after soft values provided by signal processing unit have improved. During the message re-initialization and for some subsequent amount of iterative decoder processing, extrinsic information fed back from the decoder to the signal processing unit and/or soft values delivered to the decoder from the signal processing unit, in an outer communications loop, is temporarily frozen, e.g., using a switch and a buffer. Then, the outer communications loop is restored as the decoding continues, achieving improved decoding performance.

20 Claims, 10 Drawing Sheets

U.S. PATENT DOCUMENTS

| | | | |
|---|---|---|---|
| 5,892,962 | A | 4/1999 | Cloutier |
| 5,933,650 | A | 8/1999 | van Hook et al. |
| 5,968,198 | A | 10/1999 | Hassan |
| 5,970,098 | A * | 10/1999 | Herzberg .................. 375/264 |
| 5,996,104 | A * | 11/1999 | Herzberg .................. 714/755 |
| 6,002,881 | A | 12/1999 | York et al. |
| 6,073,250 | A | 6/2000 | Luby et al. |
| 6,195,777 | B1 | 2/2001 | Luby et al. |
| 6,247,158 | B1 | 6/2001 | Smallcomb |
| 6,266,758 | B1 | 7/2001 | van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B2 | 11/2002 | Smallcomb |
| 6,526,538 | B1 | 2/2003 | Hewitt |
| 6,570,919 | B1 * | 5/2003 | Lee .................. 375/233 |
| 6,584,143 | B2 * | 6/2003 | Yu .................. 714/794 |
| 6,629,287 | B1 * | 9/2003 | Brink .................. 714/755 |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,732,327 | B1 * | 5/2004 | Heinila .................. 714/792 |
| 6,754,804 | B1 | 6/2004 | Hudepohl et al. |
| 6,799,295 | B2 | 9/2004 | Nguyen |
| 6,871,303 | B2 * | 3/2005 | Halter .................. 714/702 |
| 6,976,202 | B1 | 12/2005 | Rezvani et al. |
| 6,996,194 | B2 * | 2/2006 | Pukkila et al. .................. 375/340 |
| 7,178,080 | B2 | 2/2007 | Hocevar |
| 7,257,172 | B2 * | 8/2007 | Okamoto et al. .................. 375/341 |
| 2003/0084398 | A1 * | 5/2003 | Nguyen .................. 714/786 |
| 2005/0111564 | A1 * | 5/2005 | Kramer et al. .................. 375/265 |

OTHER PUBLICATIONS

Jing Li et al., "On the Performance of High-Rate TPC/SPC Codes and LDPC Codes Over Partial Response Channels," IEEE Transactions on Communications, IEEE Service Center, vol. 50, No. 5, May 2002, XP011070912.

Mohammad M. Mansour, Naresh R. Shanbhag, Session 11: "Low-power VLSI Decoder Architectures for LDPC Codes," Proceeding of the 2002 International Symposium on Low Power Electronics and Design, Aug. 2002, pp. 284-289.

NN77112415 "Digital Encoding of Wide Range Dynamic Analog Signals," IBM Tech. Disclosure Bulletin, Nov. 1, 1997, vol. 20, Issue 6, pp. 2415-2417.

NN9210335, "Hierarchical Coded Modulation of Data with Fast Decaying Probability Distributions," IBM Tech. Disclosure Bulletin, Oct. 1992, vol. 35, Issue 5, pp. 335-336.

Paranchych et al., "Performance of a Digital Symbol Synchronizer in Cochannel Interference and Noise," IEEE Transactions on Communications, Nov. 2000, pp. 1945-1954.

R. Blahut, "Theory and Practice of Error Control Codes," Library of Congress Cataloging in Publication Data, May 1984, pp. 47-49.

Saied Hemati, Amir H. Banihashemi, "VLSI Circuits: Iterative Decoding in Analog CMOS," Proceeding of the 13. sup.th ACM Great Lakes Symposium on VLSI Apr. 2003, pp. 15-20.

Sorokine, V. et al., "Innovative Coding Scheme for Spread-spectrum Communications," The Ninth IEEE International Symposium on Indoor and Mobile Radio Communications, vol. 3, Sep. 1998, pp. 1491-1495.

T Moors and M. Veeraraghavan, "Preliminary Specification and Explanation of Zing: An end-to-end protocol for transporting bulk data over optical circuits," May 2001, pp. 1-66.

T. Richardson and R. Urbanke, "An Introduction to the Analysis of Iterative Coding Systems," pp. 1-36.

T. Richardson and R. Urbanke, Design of Capacity-Approaching Irregular Low-Density Parity-Check Codes, Mar. 2001, pp. 1-43.

T. Richardson and R. Urbanke, "The Capacity of Low-density Parity-Check Codes Under Message-passing Decoding," IEEE Transactions on Information Theory; Feb. 2001, pp. 599-618.

T. Richardson and R. Urbanke, "The Capacity of Low-Density Parity-Check Codes under Message-Passing Decoding," Mar. 2001, pp. 1-44.

W.W. Peterson and E.J. Weldon, Jr., "Error-Correcting Codes," Second Edition, The Massachusetts Institute of Technology, 1986, pp. 212-213, 261-263, 263.

C. Douillard, M. Jezequel, C. Berrou, A. Picart, P. Didier, A. Glavieux, "Iterative Correction of Intersymbol Intereference: Turbo Equalization," European Transactions Telecommunications, vol. 6, pp. 507-511, Sep.-Oct. 1995.

Written Opinion—PCT/US04/042849, International Searching Authority—US, Alexandria, VA, Jun. 21, 2006.

* cited by examiner

— Prior Art —

— Prior Art —

METHODS AND APPARATUS FOR REDUCING ERROR FLOORS IN MESSAGE PASSING DECODERS

RELATED APPLICATIONS

The present application is a continuation of U.S. patent application Ser. No. 10/892,587, filed Jul. 16, 2004, which claims the benefit of U.S. Provisional Patent Application Ser. No. 60/531,808, filed on Dec. 22, 2003. Each of the preceding applications is hereby expressly incorporated by reference.

FIELD OF THE INVENTION

The present invention relates to improved message passing decoding methods and apparatus and, more particularly, to improved message passing decoders, e.g., low density parity check and similar types of decoders and to ways of reducing the errors in the output of such decoders.

BACKGROUND OF THE INVENTION

Nearly all forms of electronic communication and storage systems use error-correcting codes. Error correcting codes compensate for the intrinsic unreliability of information transfer in these systems by introducing redundancy into the data stream. The mathematical foundations of error correcting were established by Shannon. Shannon developed the mathematical concept of the channel in which distortion of signals in communications systems is modeled as a random process. The most fundamental result of Shannon is the Noisy channel theorem, which defines for the channel a capacity, a quantity that specifies the maximum rate at which information can be reliably delivered through the channel. This capacity is known as Shannon capacity. Reliable transmission at rates approaching capacity requires the use of error correcting codes. Thus, error-correcting codes are designed to achieve sufficient reliability while approaching capacity as closely as possible. Recent advances in error correcting coding systems resulting from the invention of turbo codes and the subsequent rediscovery and development of low-density parity-check (LDPC) codes offer coding systems of feasible complexity that can approach Shannon's capacity quite closely.

Extrinsic information in the context of information being extracted from a soft input-soft output unit is feedback information obtained by processing a previous input to the soft-input and soft-output unit. The previous input information is referred to as prior information. If there is no prior information, e.g., in the case of a first processing iteration, then the extrinsic information being extracted from the soft-input soft output unit is information obtained by a null value being substituted for the prior information of the soft-input and soft output unit.

Extrinsic information in the context of information being supplied to a soft input-soft output unit is feedback information obtained by processing a previous output of the soft-input and soft-output unit. In this case the extrinsic information being fed back to the soft-input and soft-output unit is usually interpreted as prior information to the soft-input and soft-output unit. If there is no previous output, e.g., in the case of a first processing iteration, the extrinsic information being supplied to the soft-input soft output unit is information obtained by a null value being substituted for a previous output of the soft-input and soft output unit.

LDPC codes and turbo codes are examples of iterative coding systems. Such systems are normally implemented using interconnected soft input-soft output signal processing modules. Generally, such modules implement a maximum a posteriori (MAP) algorithm, or approximate such an algorithm. In such a module there are generally one or two inputs and the purpose is to estimate a vector of quantities $X=x_1,\ldots,x_n$ which we shall assume to be binary, e.g., in $\{0,1\}$. The two inputs are a vector of soft values $Z$, which represent some external observation from, e.g., a communications channel, and another vector of soft values $W=w_1,\ldots,w_n$ which represent prior information on the bits $x_1,\ldots,x_n$. Typically the prior information takes the form of bitwise independent log-likelihood ratios $w_i=\log$ $$w_i = \log\left(\frac{p(x_i = 0 \mid U)}{p(x_i = 1 \mid U)}\right)$$

where $U$ is some information assumed independent of $Z$. The MAP algorithm associated to the signal processing module computes the posterior log-likelihood ratio, given by log $$\log\left(\frac{p(x_i = 0 \mid W, Z)}{p(x_i = 1 \mid W, Z)}\right),$$

for each bit $x_i$ depending possibly on sum assumed relationship between $X$, $U$ and $Z$. Related to the posterior log-likelihood ratio is the so-called extrinsic information associated to the calculation. In many implementations of such systems, extrinsic information is given by log $$\log\left(\frac{p(x_i = 0 \mid W, Z)}{p(x_i = 1 \mid W, Z)}\right) - w_i,$$

$-w_i$, which is ideally equal to log $$\log\left(\frac{p(x_i = 0 \mid W \setminus w_i, Z)}{p(x_i = 1 \mid W \setminus w_i, Z)}\right),$$

for each $x_i$. The extrinsic information represents the information about bit xi provided by the computation excluding the information explicitly provided in the prior information about the bit $x_i$. In practice one approximates $$\log\left(\frac{p(x_i = 0 \mid W \setminus w_i, Z)}{p(x_i = 1 \mid W \setminus w_i, Z)}\right)$$

this through quantization and/or by other means and it is generally understood that practical forms of extrinsic information may not precisely satisfy the mathematical definition. Extrinsic information need not be limited to the particular example given here which is provided as a common example of one type of extrinsic information which is frequently used in the context of some message passing decoders.

LDPC codes are well represented by bipartite graphs, often called Tanner graphs; see FIG. 1 diagram 100, in which one set of nodes, the variable nodes 102, corresponds to bits of the codeword and the other set of nodes, the constraint nodes 104, sometimes called check nodes, correspond to the set of parity-check constraints which define the code. Edges 106 in the graph connect variable nodes 102 to constraint nodes 106.

The number of edges connected to a node is known as the degree of the node. A variable node and a constraint node are said to be neighbors if they are connected by an edge in the graph. One typically assumes that a pair of nodes is connected by at most one edge. In this case, an LDPC code can equivalently be represented using a parity check matrix. FIG. 2 presents an exemplary illustration 200 where the indicated vector X 202 is a codeword if and only if H X=0, where H 204 is a parity check matrix. Illustration 200 may be an alternate representation of diagram 100 for an exemplary LDPC code.

To each variable node is associated one bit of the codeword. In some cases some of these bits might be punctured. Punctured bits may be desirable in certain code structures and they are excluded from the transmitted codeword.

A bit sequence associated one-to-one with the variable node sequence is a codeword of the code if and only if, for each constraint node, the bits neighboring the constraint (via their association with variable nodes) sum to zero modulo two, i.e., they comprise an even number of ones.

Each variable node in the graph is initially provided with a soft bit, termed a received value, that indicates an estimate of the associated bit's value as determined by observations from, e.g., the communications channel. Ideally, the estimates for separate bits are statistically independent. This ideal can be, and often is, violated in practice. A collection of received values constitutes a received word. For purposes of this application we may identify the received word with the prior information provided to the decoder. The decoders and decoding algorithms used to decode LDPC codewords operate by exchanging messages along the edges of the Tanner graph. The nodes compute the messages usually as a function of the incoming messages, including the received value in the case of variable nodes. Such algorithms will be generally referred to as message-passing algorithms.

It will be appreciated that received words generated in conjunction with LDPC coding, can be processed by performing LDPC decoding operations thereon, e.g., error correction and detection operations, to generate a reconstructed version of the original codeword. The reconstructed codeword is made up of the hard decisions associated to the bit-wise posterior information computed by the decoder. The reconstructed codeword can then be subject to data decoding to recover the original data that was coded. The data decoding process may be, e.g., simply selecting a specific subset of the bits from the reconstructed codeword.

As mentioned above, LDPC decoding operations generally comprise message-passing algorithms. There are many potentially useful message-passing algorithms and the use of such algorithms is not limited to LDPC decoding. One of the most powerful of such algorithms is known as belief propagation. Belief propagation uses MAP decoding at each of the nodes in the Tanner graph together with exchange of messages along the edges of the graph. To facilitate an understanding of the invention discussed in the sections that follow, we will now give a brief mathematical description of belief propagation.

Belief propagation for (binary) LDPC codes can be expressed as follows. Messages transmitted along the edges of the graph are interpreted as log-likelihood ratios $$\log \frac{p_0}{p_1}$$

for the bit associated to the variable node. Here, $(p_0, p_1)$ represents a conditional probability distribution on the associated bit where $p_x$ denotes the probability that the bit takes the value x. The prior information provided to the decoder is normally also given in the form of a log-likelihood. In general, a message m represents the log-likelihood ratio m and a received value or prior information y represents the log-likelihood ratio y. For punctured bits the log-likelihood ratio received value y is set to 0, indicating $p_0=p_1=\frac{1}{2}$.

Let us describe the message-passing rules of belief propagation. Messages are denoted by $m^{C2V}$ for messages from check nodes to variable nodes and by $m^{V2C}$ for messages from variable nodes to check nodes. Consider a variable node with d edges. For each edge j=1, ..., d let $m^{C2V}(i)$ denote the incoming message on edge i. At the initialization of the decoding process we set $m^{C2V}=0$ for every edge. In general, outgoing messages from variable nodes are given by $$m^{V2C}(j) = y + \left(\sum_{i=1}^{d} m^{C2V}(i)\right) - m^{C2V}(j).$$

The outgoing decoded soft value from a node (not an edge message) corresponding to this operation is given by $$x_{out} = y + \left(\sum_{i=1}^{d} m^{C2V}(i)\right).$$

This value is posterior information provided by the decoder. The outgoing hard decision associated to this output is obtained from the sign of $x_{out}$. The extrinsic information associated to the given bit is similarly given by $$\left(\sum_{i=1}^{d} m^{C2V}(i)\right).$$

The output posterior and extrinsic information depend on the number of iterations performed. This is because the information expressed in these outgoing quantities increases, at least in principle, with the number of iterations performed.

At the check nodes, also sometimes referred to as constraint nodes, the update can be expressed in several ways. One mathematically convenient form for a check node of degree d is the following $$m^{C2V}(j) = \tan h^{-1}(\Pi_{i=1}^{d} \tan h(m^{V2C}(i))/\tan h(m^{V2C})),$$

Turbo equalizers shall now be described. Many communications or storage channels of interest exhibit intersymbol interference (ISI). When ISI is present each symbol observed at the receiver has contributions from several transmitted symbols. This can be interpreted as an observation of the nominal or desired symbol in the presence of interference from other symbols. Typically, part of the signal processing that occurs at the receiver in such a case is dedicated to removing or reducing ISI. For the illustrative purposes we shall assume that the transmitted symbols are binary, e.g., bits. ISI removal occurs in soft-input soft-output signal processing module that will be referred to as an ISI detector. The ISI detector is assume to have inputs Z, corresponding to raw information provided by the channel, and prior information W on the bits X that constitute the transmitted symbols. Often, the bits X are additionally constrained in that they also form a codeword of, e.g., an LDPC code or a turbo code. With LDPC or turbo decoding, extrinsic information about transmitted symbols produced as part of the decoding process can be used as prior information by the ISI detector.

If the extrinsic information generated during decoding is fed back to the ISI detector, then ISI removal can normally be improved. This then enables the ISI detector to provide improved estimates (soft values in the form of the extrinsic information from the detector) to the decoder, which then is able to feed back better information to the detector. Such a process is used to perform turbo equalization.

FIG. 3 is a drawing 300 depicting a turbo equalization process. Turbo equalizers are schemes in which equalization or ISI removal is performed in conjunction with soft decoding, such as LDPC or turbo code decoding in a feedback scheme where extrinsic information produced by the decoder is used by the equalizer as prior information to improve its performance and the extrinsic information produced by the ISI detector is used as prior information (received values) by the decoder. Through the feedback of extrinsic information both MAP signal processing modules, the ISI detector and decoder improve the performance of the other thereby improving the overall performance of the system information provided to the decoder.

FIG. 3 includes an ISI detector 302 and an iterative decoder 304, e.g., and LDPC or turbo decoder. External input 306, e.g., received signal observed at the receiver including ISI are input to the ISI detector 302. The ISI detector 302, using its knowledge of interfering symbols and the nature of the interference, generates extrinsic information 308, e.g. soft values, and feeds the extrinsic information 308 about the transmitted symbols, e.g., bits, to the prior input of the iterative decoder 304. (In the first pass, when there is no prior information about the transmitted symbols available to the detector from the decoder, the extrinsic information is set equal to the posterior information.) The iterative decoder 304, performs soft decoding, e.g., using a message passing algorithm. As part of the decoding process, extrinsic information 310 about the transmitted symbols, e.g., soft values, is generated and fed back to the ISI detector 302 as prior information. The ISI detector 302, can use the extrinsic information 310 as prior information on the transmitted symbols to improve the removal of ISI and generate new soft values 308. The new extrinsic information 308 now supplied to the iterative decoder 304 is an improved prior. This can result in an improved decoding by the iterative decoder 304 and improved extrinsic information 310 being fed back to the ISI detection. This iterative process can continue. At some point, the rate of performance increase decreases, and it may be decided that performing further iterations would not be productive. The iterative decoder 304 outputs the decisions of the decoder, e.g., the decoded information 312 with an associated probability.

The algorithms used in Turbo Equalization are typically message-passing schemes. There is a great deal of literature on turbo equalization. One of the references is the following: C. Douillard, M. Jezequel, C. Berrou, A. Picart, P. Didier, A. Glavieux, "Iterative correction of intersymbol interference: turbo equalization," European Transactions Telecommunication, vol. 6, pp. 507-511, September-October 1995. Turbo Equalization may be used with LPDC codes.

While Turbo Equalization in the context of message passing decoders has proven very beneficial in many cases, in some cases during decoding improvements in the input to an iterative message passing decoder cease to result in improvements in the decoding result. It would be desirable if methods and/or apparatus could be developed to improve the ability of an iterative decoder to take advantage of improvements in the input to the decoder in at least some cases where the improvement in the decoder input might not have a beneficial impact on the ultimate decoding result.

SUMMARY OF THE INVENTION

The present invention is directed to reducing the minimum number of errors which can not be corrected through the use of a soft input-soft output processing operation, e.g., an ISI detection and correction operation, in conjunction with iterative decoding operations. The present invention is particularly well suited for use in turbo equalizers which use an ISI Detector in combination with an iterative message passing decoder, e.g., an LDPC decoder.

An iterative message passing decoder, e.g., an LDPC decoder or turbo decoder, operating in conjunction with a soft input-soft output signal processing unit such as a soft detector, e.g., an ISI detector, has an error floor performance region influenced by the sub-optimal message passing nature of the iterative decoder.

Error floor reduction, an improvement in the error rate performance at relatively low error rates, can be achieved, in many cases, by a simple mechanism, in accordance with the invention. Various aspects and features of the invention are directed toward apparatus and methods used to achieve error floor reduction in iterative decoder systems.

The soft input-soft output signal processing unit receives external data values to be decoded. The iterative decoder and the soft input-soft output signal processing unit may be coupled together, and an outer communications loop may be formed through which feedback information flows, e.g., soft information values in the form of extrinsic information from an output of the soft input-soft output signal processing unit to an input, e.g. a prior information input, of the iterative decoder and feedback information in the form of extrinsic information from an output of the iterative decoder to an input, e.g. a prior information input, of the soft input-soft output signal processing unit. On average, the feedback information, e.g., extrinsic information soft values returned from the soft input-soft output signal processing unit, improve as the decoding iterations proceed. However, during the decoding process the message passing decoder may become trapped in a bad state, e.g., due to the nature of the decoder, and the full benefit of the improved soft information values may consequently not be realized by the decoder.

In accordance with a feature of the invention, decoder edge states, e.g., constraint to variable node messages in decoder memory, are reinitialized or cleared, e.g., for an iteration, during the decoding process after soft information values provided by the soft input-soft output signal processing unit have improved. This acts as an iterative decoder reset operation. For example, a decoder error detection module may count a pre-selected number of iterations from the start of decoding for a set of input data values, and if the codeword has not been successfully decoded, the error detection module may notify a message re-initialization module in the decoder. Alternative mechanisms to trigger the re-initialization are possible in accordance with the invention. For example, a decoding system may have different levels of decoding performance and/or requirements, each performance level and/or requirement having an associated pre-selected number of iterative decoder message passing iterations and/or a pre-selected amount of time in which to successfully decode a codeword or the message re-initialization is triggered. In some embodiments, other constraints, e.g., real time system requirements for the output of decoded data may dynamically influence the decision and generation of message re-initialization, e.g., when and if messages inside the decoder are re-initialized prior to a successful decoding. The message re-initialization module may notify an interruption module in the decoder of an impending re-initialization and clear C2V messages in memory of the decoder for one iteration. Message re-initialization normally involves resetting decoder messages being re-initialized to a default value used at the start of decoding.

In some embodiments, during the message re-initialization and for some subsequent amount of iterative decoder processing, extrinsic information fed back from the decoder to the soft input-soft output signal processing unit and/or soft extrinsic information values delivered to the iterative decoder from the signal processing unit, in the outer communications loop, are temporarily frozen. For example, a switch, e.g., a controllable switch, may couple the extrinsic information output of the iterative decoder to an extrinsic information buffer, and an extrinsic information buffer may couple the switch to the extrinsic information prior information input of the soft input-soft output signal processing unit. Alternatively, a switch, e.g., a controllable switch, may couple the soft information value output of the soft input-soft output signal processing unit to a soft information value buffer, and the soft information value buffer may couple the switch to the prior information input of the iterative decoder.

In some embodiments, a timer or iteration counter is used to control operation of the controllable switch. For example, the interruption module can generate a reset signal to the timer or iteration counter, resulting in the timer or iteration counter sending a signal to the switch causing the switch to open. Then, the timer or iteration counter can increment until a measured time or count is reached corresponding to a pre-selected stored decoder processing time or a pre-selected number of decoder iterations, in which case the signal to the switch is changed to close the switch. Alternative control implementations of the switch and switch control are possible, in accordance with the invention. For example, control signaling may be directly between decoder and switch, e.g., the interruption module controlling signaling for opening the switch and a restoration module in the decoder controlling signaling for closing the switch.

By opening the outer communications feedback loop through the switch and temporarily using the frozen information in the buffer, the quality of the soft information values input to the iterative decoder as prior information remains good, following the re-initialization of decoder messages, even though the quality of the extrinsic information output from the decoder may temporarily become poor, e.g., due to the intentional resetting of messages representing information accumulated over multiple decoding iterations.

After some amount of decoder processing, e.g., a predetermined number of decoder iterations or a predetermined amount of decoder processing time, the outer communications loop is restored. As the controlled switch is closed, the buffer is updated, and decoding continues with a closed outer communications loop, achieving, in many cases, improved decoding performance than would have been otherwise possible if the decoder messages had not been reset and the outer loop buffer data was not temporarily frozen during the decoding process. At some subsequent point, e.g., after a predetermined number of decoder iterations, a predetermined amount of time, an estimated decoding performance level is achieved, a rate of improvement in performance level falls to a specified level, a codeword is successfully decoded, and/or an external event intercedes, e.g., no additional time available for decoding operations, the decoded information and associated probability information is output from the decoder.

Various other reset implementations are possible. In general, the re-initialization process is employed for detectable failures. However, in some embodiments, the message re-initialization process may be invoked even though a failure was not detected, e.g., all parity checks were satisfied or simply at some point during decoder processing. In such an embodiment, the re-initialization may be useful to improve performance where undetected failures occur.

In some embodiments, the soft input-soft output signal processing unit, e.g., detector, may operate at a different speed than the decoder. In such embodiments, the outer communications feedback loop may operate at a different rate than the inner iterative decoder internal message passing loop. In some embodiments, e.g., where the outer communications feedback loop is sufficiently slower than the inner decoder message passing loop and the decoder and signal processing unit are synchronized, a switch and extrinsic or soft values buffer combination may not used, and the message re-initialization of internal decoder messages, e.g., check node to variable node (c2v) messages may be performed without opening the outer loop. The difference in inner and outer loop iteration rates makes such an implementation possible without the need for outer loop buffering. In such an embodiment, the soft input-soft output signal processing unit may function as a buffer, and the time difference between inner and outer loops may allow the decoder to converge sufficiently before its extrinsic output is used again, following message re-initialization, by the soft input-soft output signal processing unit.

Apparatus and methods in accordance with the invention may be used in decoding operations in a wide range of communication and/or storage devices and/or systems using error correcting codes, e.g., wireless communication systems, fiber optics communications systems, magnetic storage systems, optical storage systems, etc.

DETAILED DESCRIPTION OF THE INVENTION

As will be discussed below, the present invention applies to a wide range of LDPC decoding systems as well as other types of message passing decoding systems, e.g., Turbo code decoders.

The current invention is directed to, among other things, methods and apparatus that provide a simple mechanism for improving the performance of a decoder system including a decoder such as an LDPC decoder or a turbo decoder in conjunction with a soft input-soft output signal processing unit such as a soft detector, e.g. an ISI detector. An improvement provided by the invention may be realized as an error floor reduction, e.g., an improvement in the error rate performance, e.g., at relatively low error rates. The present invention arises from an insight into the nature of error floor events in message passing decoders, e.g., LDPC decoders and other similar decoders. It was realized that in such decoders the failure can occur as a result of the sub-optimal message-passing nature of the decoder. For example, the decoder may attempt to find a bit assignment that satisfies all parity checks but sometimes it may fail to do so. Such a failure is deemed detectable because the decoder can recognize that all parity checks are not satisfied. The proposed invention, however, can also apply for undetected failures, which are failures where all parity checks are satisfied.

The error floor performance region of an LDPC decoder is usually described by the performance curve of the system. The decoder system typically exhibits rapid improvement in performance as the quality, such as SNR, of the input signal improves. The performance curves that result are often referred to as waterfall curves. At some point, however, for sufficiently high quality or SNR, the rate of performance improvement with SNR increase decreases, indicating the floor of the waterfall region.

Figure 6:
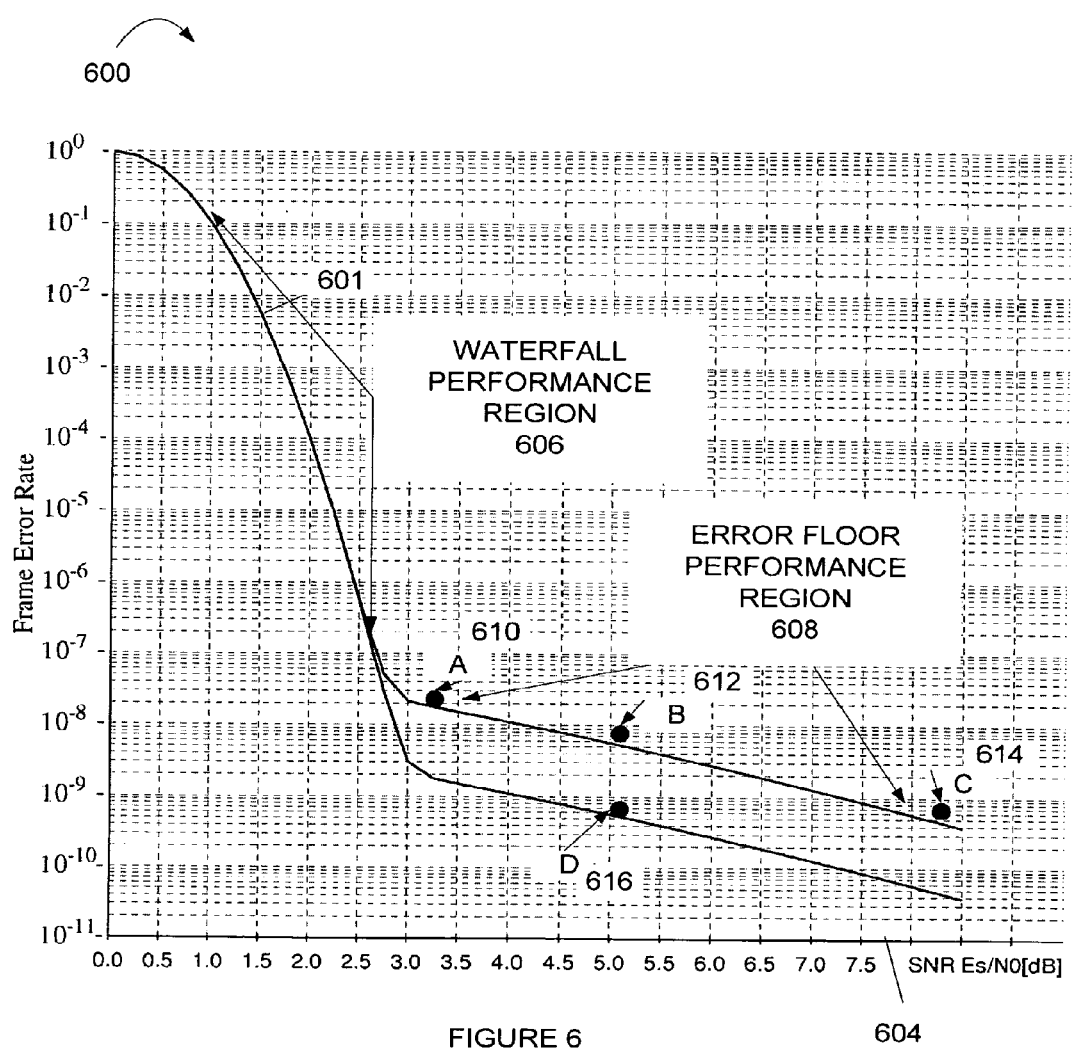
FIG. 6 is an example of an exemplary coding performance curve illustrating that the error floor performance region can be changed, resulting in improved decoding performance, in accordance with the present invention.
Figure 7A:
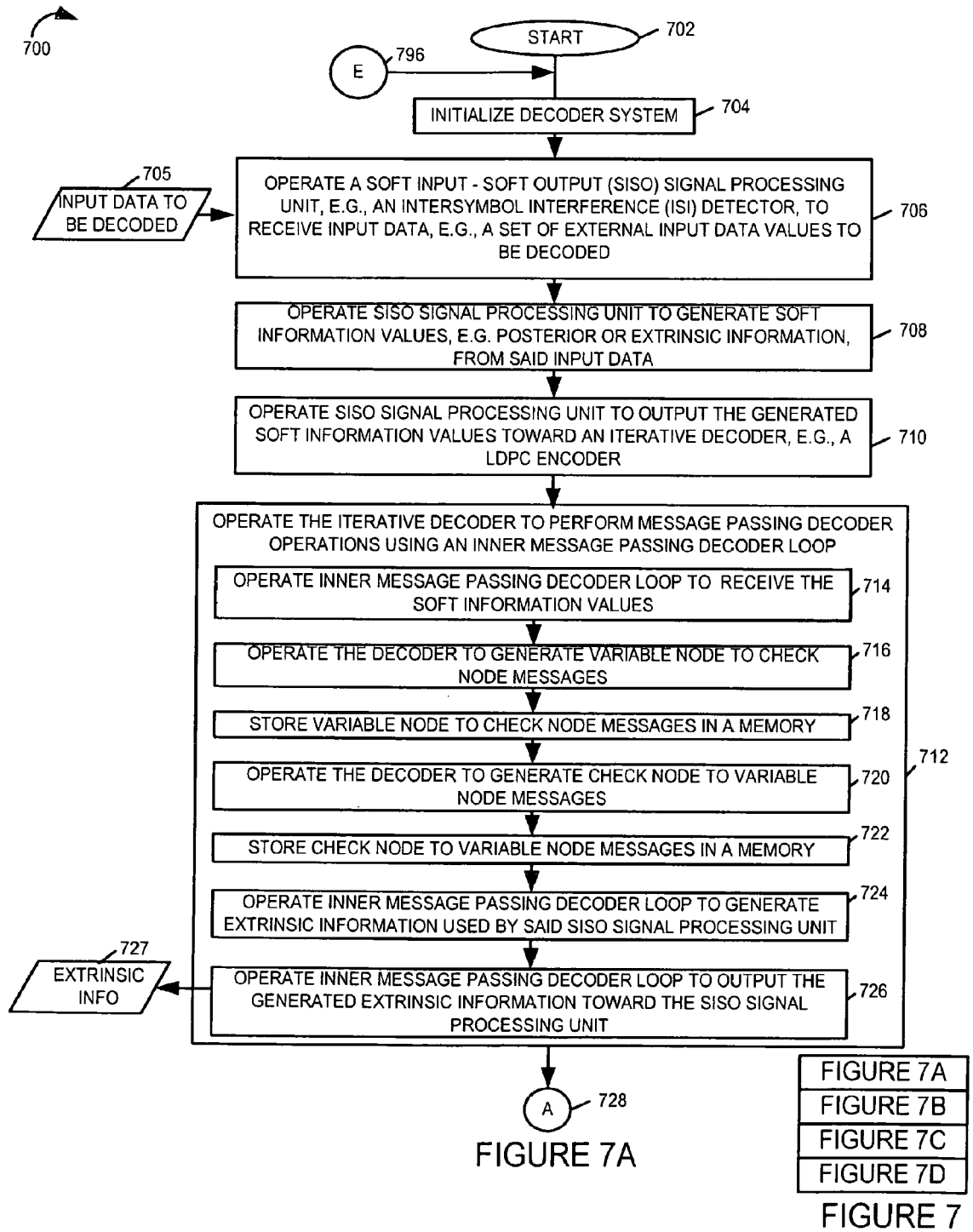
FIG. 7 is a flowchart illustrating an exemplary method of decoding data input to be decoded in accordance with the present invention.
Figure 7B:
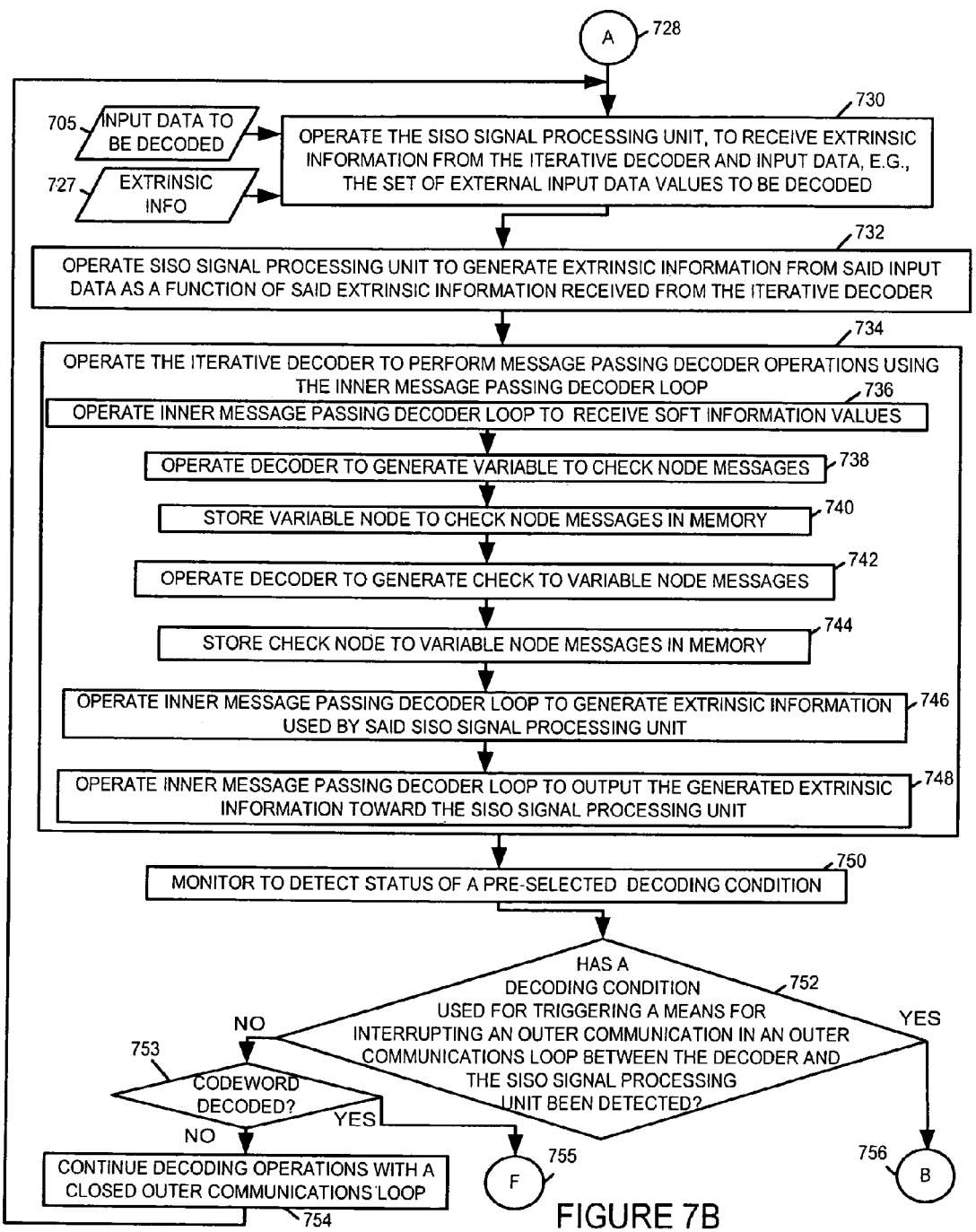
Figure 7C:
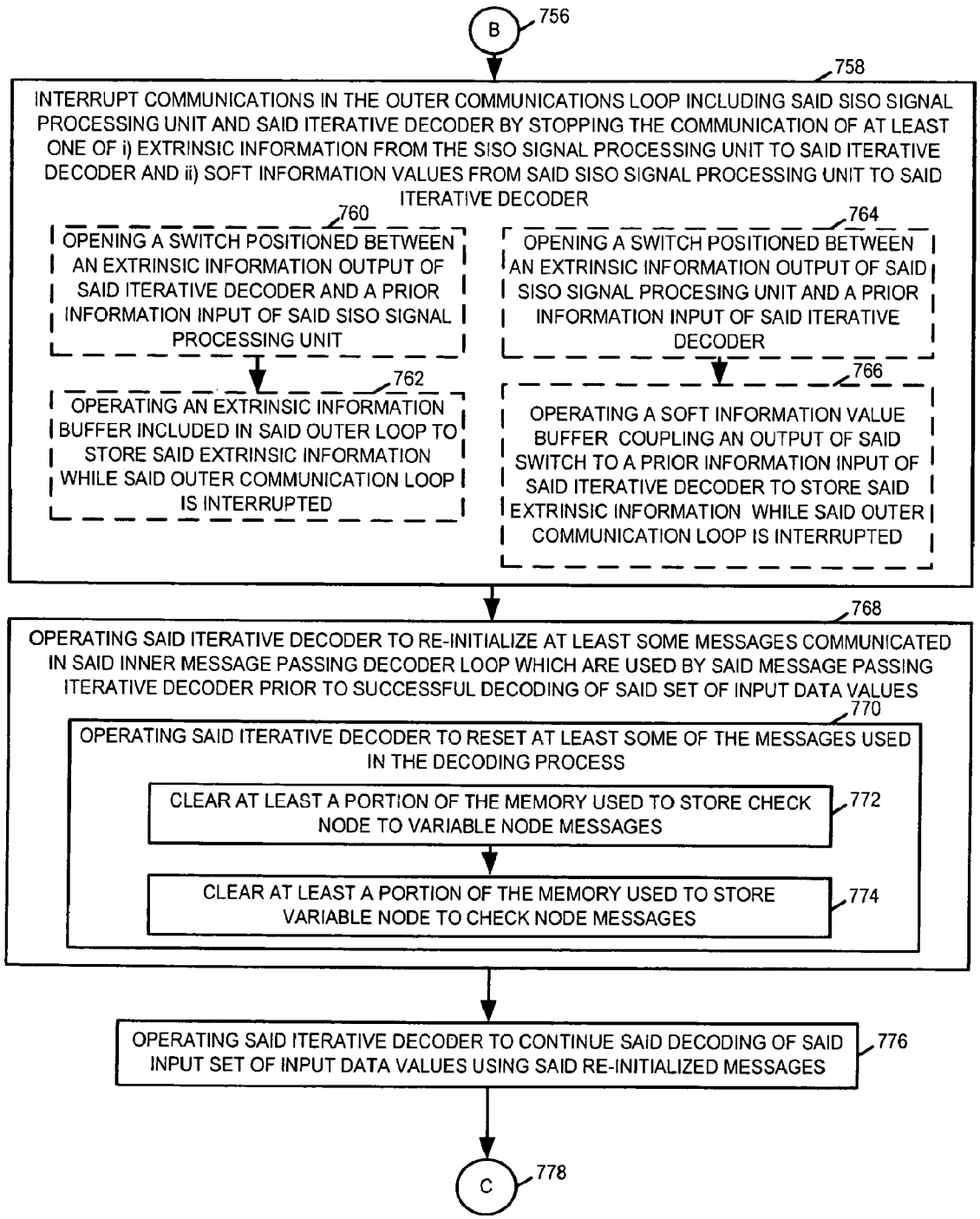
Figure 7D:
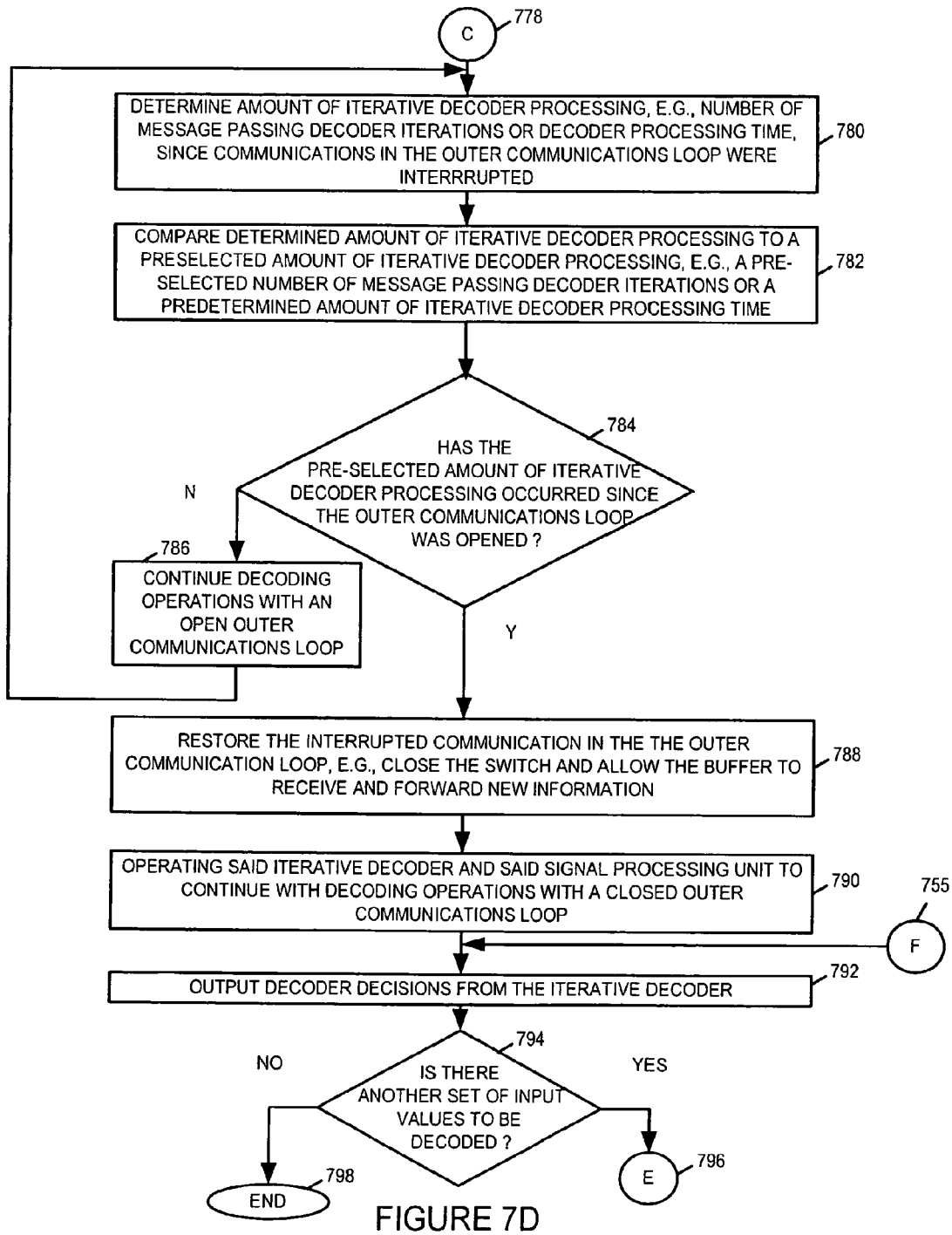

FIG. 6 depicts a graph 600 of an exemplary coding performance curve 601. Graph 600 plots frame error rate on the vertical axis 602 vs SNR in dB Es/No on the horizontal axis 604. Performance curve 601 includes a waterfall performance region 606 and an error floor performance region 608. In the error floor performance region 608 the decoding failures usually correspond to a relatively small number of incorrect bits that give rise to mostly satisfied constraints but, usually, also a small number of unsatisfied constraints. When this happens messages in the decoder coming from satisfied constraints can reinforce the incorrect decisions so that, even if the input to the decoder is set to the correct bits, the decoder remains trapped in the error producing message-passing state. Thus, the failure is maintained as part of the dynamics of the message-passing decoder algorithm. Such an occurrence is expected to occur when using an LDPC or turbo decoder in turbo equalization, e.g., in conjunction with soft ISI detection. On average, the so-called extrinsic information returned from the ISI detector to the decoder improves as iterations proceed. The message passing decoder may already have become trapped in a bad state, however, and the full benefit of the improved information is consequently not realized. If, however, the decoder edge message states in the decoder are reinitialized or cleared after the extrinsic information provided by the ISI detector has improved, then the corrected input can lead to a correct decoding. Thus, reinitializing or clearing messages in the decoder after several iterations given that decoding has not yet converged to a known codeword, can improve the performance of the overall system. In some cases, this improvement can be significant.

Under belief propagation decoding, in, e.g., an LDPC decoder which passes messages back and forth between check nodes and variable nodes, reinitialization could be performed by setting all c2v messages to 0 in a given iteration where 0 is the value normally used to initialize such messages, e.g., at the start of decoding. This operation can, and sometimes is performed in accordance with one feature of the invention, even when the decoding has converged to a known codeword, potentially improving performance in the case of undetected failure. The re-initialization and continued decoding incurs a complexity cost, e.g., in terms of the number of processing operations that it requires and the complexity of implementing decoders capable of such reinitialization. Given the amount of processing required with each reinitialization, it is desirable therefore, in many embodiments, to limit reinitialization use, e.g., to cases likely to provide worthwhile benefit in terms of reduced errors. If restricted to detected failure then the reinitialization will be invoked when there is a detected decoding failure but not at other times. Detected decoding failures, e.g., failure for the decoding result to converge to a known codeword, tend to be relatively rare events when operating in the error floor region with a well-designed code. When implementing the invention in the context of a turbo equalizer or soft ISI detector, the extrinsic information fed back from the decoder to the ISI detector and/or the extrinsic information delivered to the decoder from the ISI detector should, and in some implementations is, temporarily frozen, e.g., temporarily not updated immediately after the reinitialization. After several message passing iterations following the reinitialization and freezing operation, the feedback information from the decoder is once again supplied to the ISI detector and/or the extrinsic information feed back to the decoder from the ISI detector is once again enabled.

Figure 1:
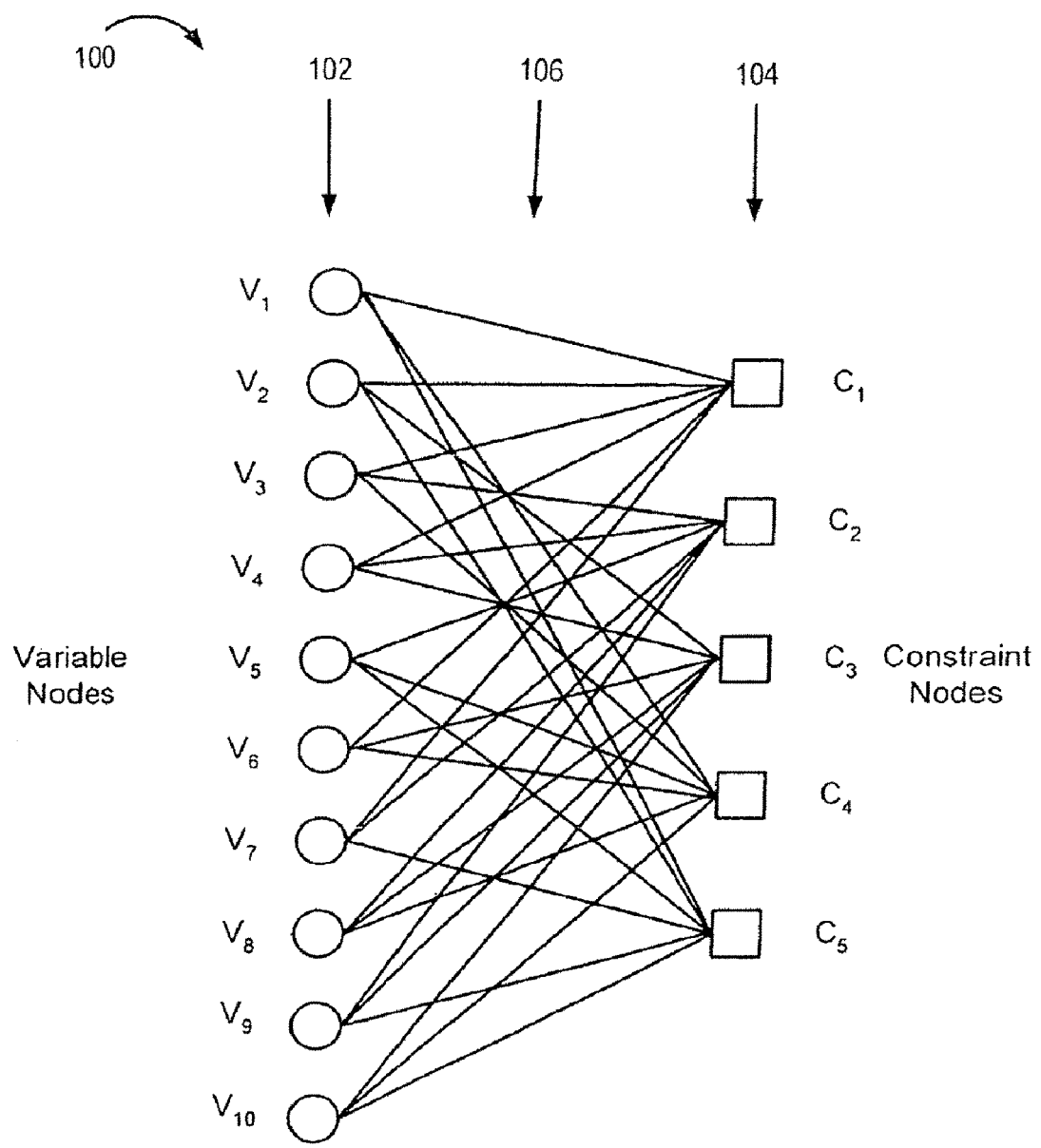
FIG. 1 is a diagram of an exemplary bipartite graph that may be used to represent LDPC codes.
Figure 2:
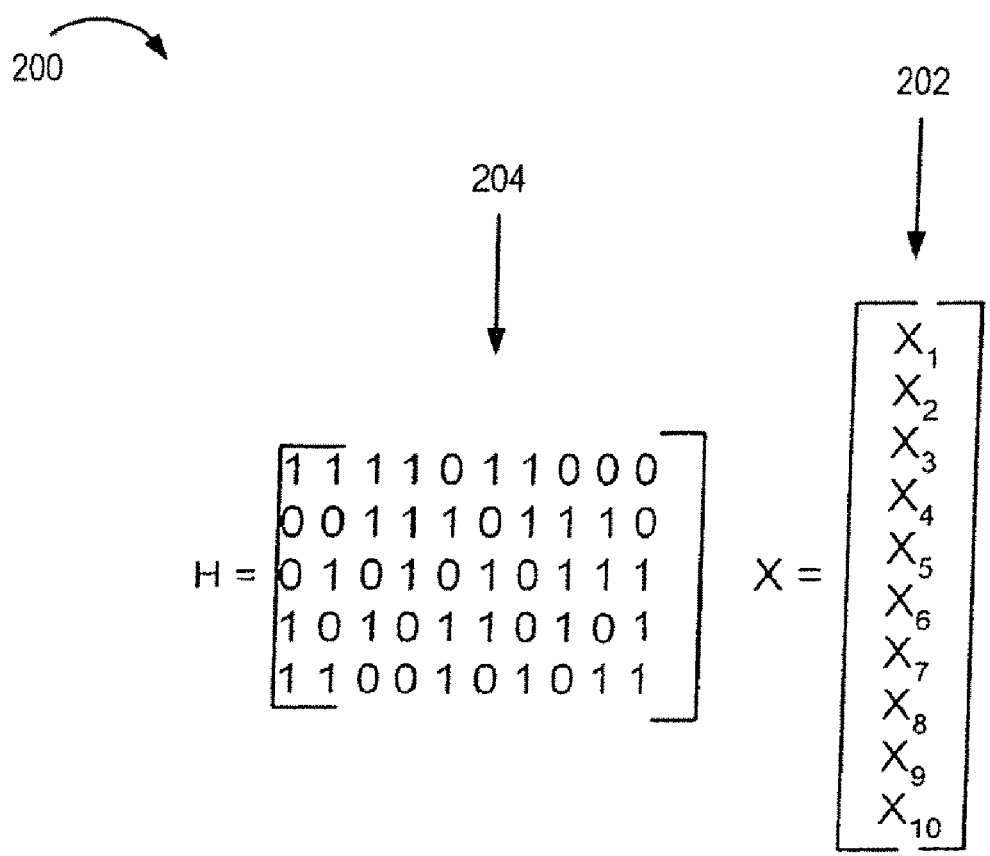
FIG. 2 is an example of an LDPC code representation using a parity check matrix.
Figure 3:
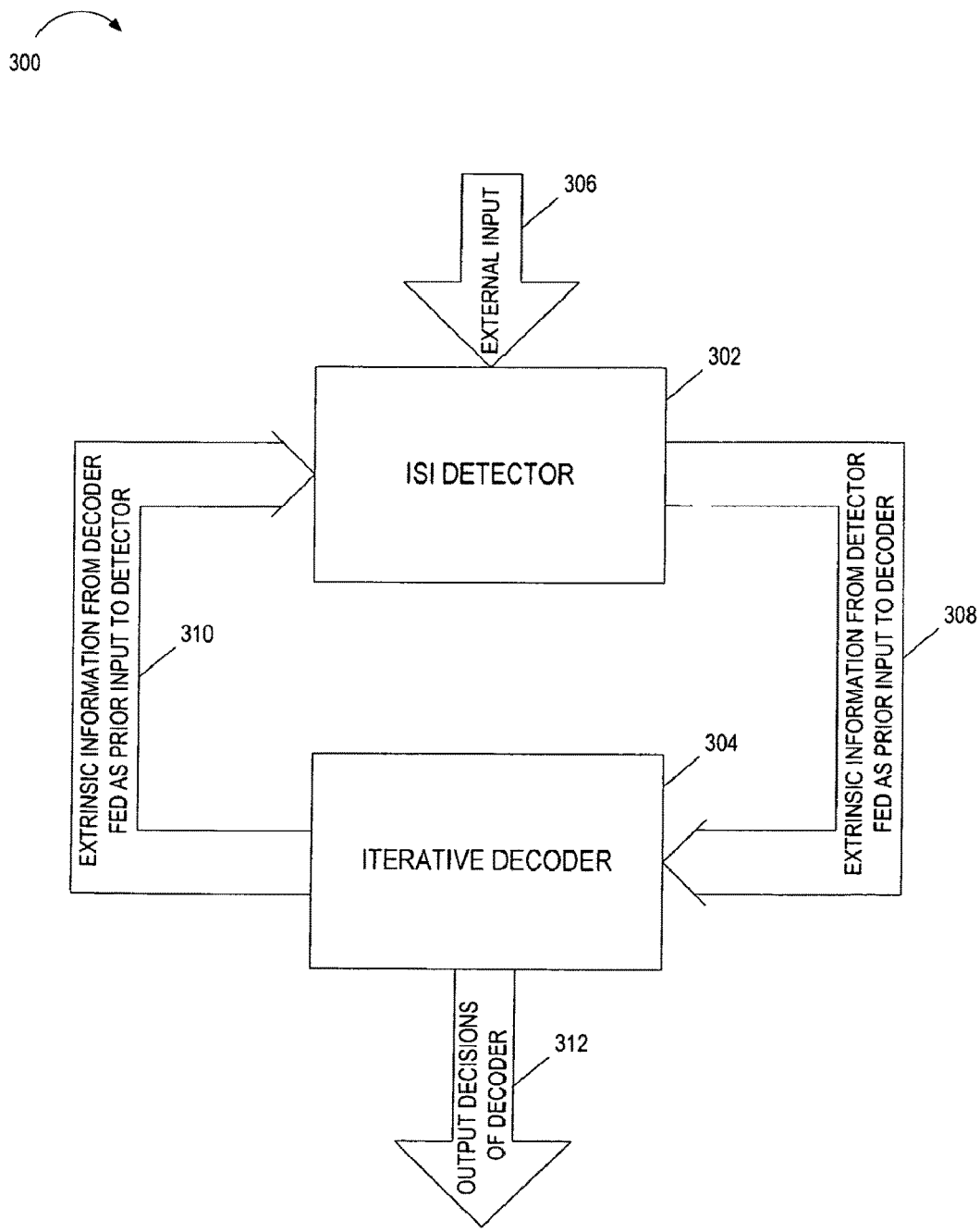
FIG. 3 is an example of a known turbo equalization process.
Figure 4:
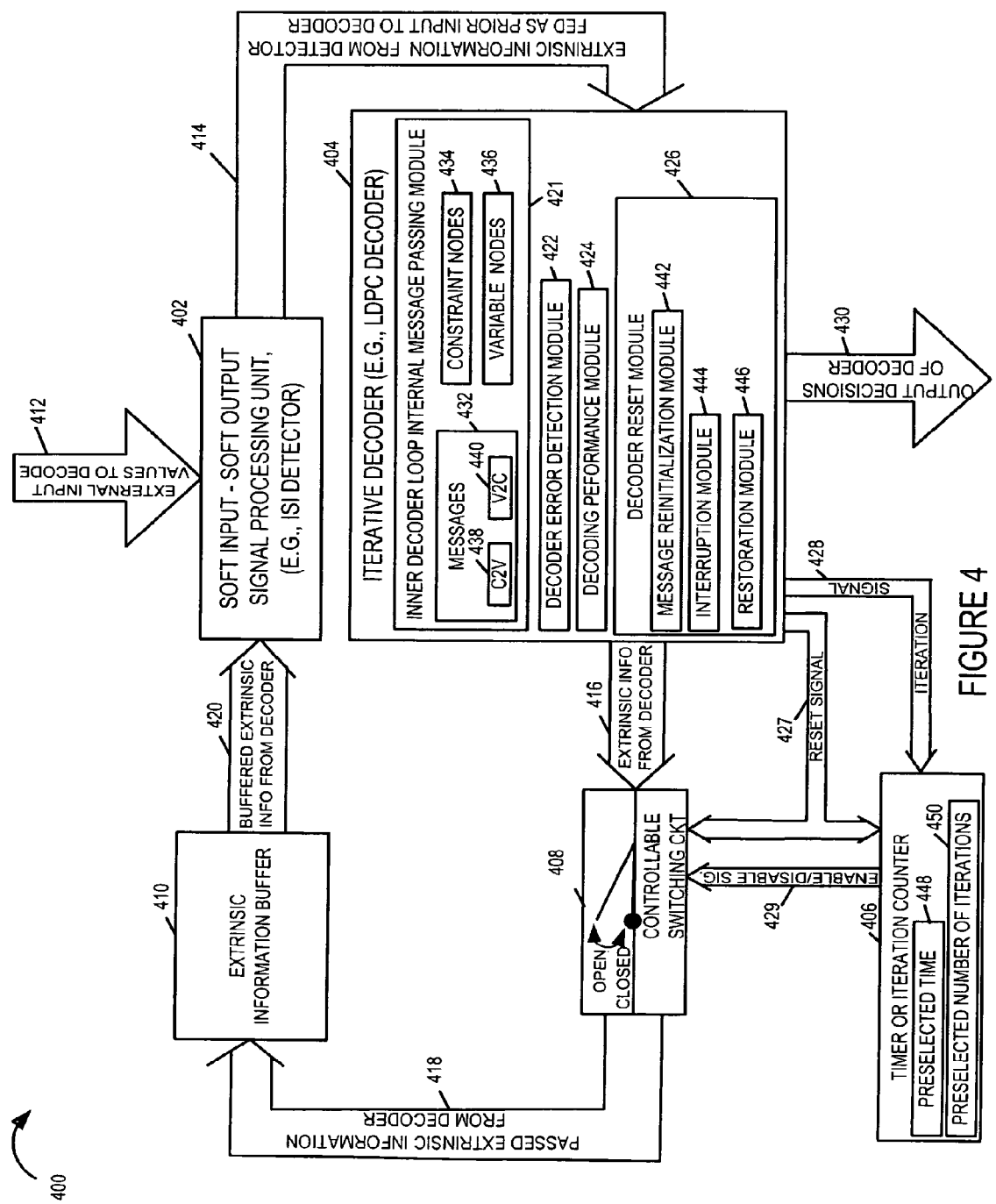
FIG. 4 is an exemplary embodiment of an apparatus for performing decoding operations, said apparatus including an error floor reducing mechanism implemented in accordance with the present invention and using methods of the present invention.

FIG. 4 is a drawing illustrating an exemplary apparatus 400 for performing decoding operations, said apparatus 400 including an error floor reducing mechanism implemented in accordance with the present invention and using methods of the present invention. Exemplary apparatus 400 includes a soft input-soft output signal processing unit, e.g., an ISI detector, 402, an iterative decoder, e.g., an LPDC or turbo decoder, 404, a time or iteration counter 406, a controllable enable/disable switching circuit 408, and an extrinsic information buffer 410. Apparatus 400 includes an outer decoding communication loop and an inner decoding loop.

The outer decoding communication loop comprises the soft input-soft output signal processing unit 402, the iterative decoder 404, the controllable switching circuit 408, and the extrinsic information buffer 410 which are coupled together as shown in FIG. 4. The inner decoding loop, e.g., a message passing loop between constraint and variable nodes, is internal to the iterative decoder 404. External input values to be decoded 412, e.g., received signal including ISI, are input to the soft input-soft output signal processing unit 402. The soft input-soft output signal processing unit 402, e.g., using its knowledge of interfering symbols and the nature of the interference, generates and outputs extrinsic information values 414 which are input to the iterative decoder 404 as prior information. Initially, when the extrinsic information from the decoder is not available, the extrinsic information from the soft input-soft output signal processing unit 402 is equal to the posterior information. The iterative decoder 404, e.g., an LDPC or turbo decoder, implemented in accordance with the invention, performs soft decoding, e.g., using a message passing method. Iterative decoder 404 includes an inner decoding loop internal message passing module 421. Module 421 includes messages 432, constraint nodes 434, and variable node 436. Module 421 passes c2v messages 438 from the constraint nodes 434 to the variable nodes 436 and v2c messages 440 from the variable nodes 436 to the constraint nodes 434 in an iterative manner as part of decoder processing. Also as part of the decoding process extrinsic information 416 about the transmitted symbols, e.g., updated soft values and/or reliability information, is generated and output from iterative decoder 404 and forwarded as input to the enable/disable switching circuit 408. At this time, the switching circuit 408 is in a closed position, and the extrinsic information 416 passes through the switching circuit 408 resulting in extrinsic information 418 being input to the extrinsic information buffer 410, where the extrinsic information 418 is stored. The extrinsic information buffer 410 outputs the stored information as extrinsic information 420 being input into the soft input-soft output signal processing unit 402 as prior information on the transmitted symbols. The soft input-soft output signal processing unit 402 can use the received extrinsic information 420, originally sourced from the decoder 404 to improve, e.g., refine the process of removing ISI, and generate new extrinsic information values 414. The new extrinsic information values 414 now supplied to the iterative decoder 404 are improved estimates. This can result in improved decoding by the iterative decoder 404 and improve the new extrinsic information 416 being subsequently generated and forwarded toward the soft input-soft output signal processing unit 402 along the path previously described. This iterative process can continue; however, at some point a decoding error may be detected (e.g., a failure to decode to known codeword may be detected), the rate of performance increase may decrease below some threshold, a predetermined number of iterations may have been performed, the decoder may decide that performing further iterations without a reset would not be productive, and/or some other trigger mechanism may be invoked, thereby starting a decoder message re-initialization process in accordance with the invention.

The exemplary iterative decoder 404 includes a decoder error detection module 422, a decoding performance module 424, and a decoder reset module 426. The decoder error detection module 422 may detect failures, e.g., recognize that all parity checks are not satisfied when the decoder has attempted to find a bit assignment that satisfies all parity checks but has failed to do so, e.g., after a specified number of iterative decoder message passing iterations and/or a pre-selected amount of time. Such detected failure information may be forwarded to the decoder reset module 426. The decoding error performance module 424 may estimate decoding error performance, evaluate changes in performance, and/or rates of changes in performance and forward such information to the decoder reset module 426. The decoder reset module 426 uses information from the decoder error module 422 and the decoding error performance module 424 to make decisions as to the initiation of a decoder reset and the generation of a decoder reset. The decoder reset module 426 includes a message reinitialization module 442, an interruption module 446, and a restoration module 446. A decoder reset, when invoked includes a reinitialization of at least some of the edge messages 432, e.g., setting c2v (constraint to variable messages) 438 to 0, within the iterative decoder 404 memory for a given iteration, under the direction of the message re-initialization module 442. In some embodiments, v2c (variable to constraint) messages in iterative decoder memory may also be cleared as part of the re-initialization during decoding. At this time, it is advantageous to not update the extrinsic information 420 being used by the soft input-soft output signal processing unit as prior information, e.g., for a period of time; therefore, controllable switching circuit 408 is opened, under the control of the interruption module 444, e.g., for several iterations to allow the decoder 404 to partially re-converge, and the information stored in extrinsic buffer 410 remains fixed resulting in a continuous stream of reasonable soft extrinsic information values 414 being provided to the input of the iterative decoder 404. When deemed appropriate, switch 408 is closed, under the direction of the restoration module 446 and/or the timer or iteration counter 406, completing and reestablishing the outer communications loop feedback path between the decoder 404 and soft input-soft output signal processing unit 402. The decoding process including a closed outer communication loop path providing new passed extrinsic information 418 to the soft input-soft output signal processing unit 402 resumes, and, in many cases, a lower error floor is achieved by the decoder 404, than would have otherwise been possible without the re-initialization of the decoder 404 and the temporary suspension of new feedback data to the soft input-soft output signal processing unit 402. At some point a decision is made by the decoder 404, e.g., based on a successfully decoded codeword, a number of iterations and/or an estimated value of the decoding performance module to output the decisions of the decoder, e.g., the decoded information 430 with an associated probability.

As shown in FIG. 4, a simple controllable switching circuit 408 can be used to enable/disable the outer communication loop feedback. Various alternatives may be used to control the opening and closing of the switching circuit 408. For example, in some embodiments, the switching circuit 408 may be coupled to and controlled by a timer or iteration counter 406. The point at which the switching circuit 408 is opened may be controlled by a reset signal 427 generated by interruption module 444 of the iterative decoder 404 and sent to the timer or iteration counter 406 as part of a re-initialization process. In addition to the reset signal 427, the iterative decoder 404 may be responsible for generating an iteration or other timing signal 428 used to drive the timer or iteration counter 406. The timer or iteration counter 406 may include a pre-selected amount of decoder processing time 448 and/or a pre-selected number of message passing decoder iterations 450 used for determining the length of the duration of the opening of the switch 408, when a reset is initiated. The reset signal 427 generated by the iterative decoder 404 may control the opening of the switching circuit 408 by triggering the timer or iteration counter 406 to generate an enable/disable signal 429 to cause the switching circuit 408 to open. Then, the timer or iteration counter 406 can hold the enable/disable signal 429 in the switch open state until the pre-selected time 448 or pre-selected number of iterations 450 has been reached, wherein the enable/disable signal 429 is changed to a signal that causes the switching circuit 408 to close.

Alternately, in some embodiments, the reset signal 427 generated by the interruption module 444 of the iterative decoder 404 may control the opening of the switching circuit 408 directly to cause the switching circuit 408 to open, and the state of the reset signal 427 may be changed by the restoration module 446 of the iterative decoder 404 causing the switching circuit to close. In such an embodiment a pre-selected amount of iterative decoder processing, e.g., a pre-selected amount of iterative decoder processing time or number of message passing decoder iterations, may be measured and used in the determination when the decoder 404 will cause the switch to open. The decoder 404 may cause the switch to close after a predetermined amount of decoder processing time or decoder iterations following the opening of the switch.

The reason for freezing the outer feedback loop temporarily upon decoder 404 reset which is implemented as part of the process of continuing to decode a set of information is the following. Clearing the edge messages 432 in the decoder 404 temporarily degrades the extrinsic information being returned to the soft input-soft output signal processing unit 402 from the decoder 404, at least for the bits not participating in the failure event, which is usually the vast majority when operating in the error floor region. It is desirable to mask this temporary degradation from the soft information values, e.g.

extrinsic information from the detector, 414 being fed into the decoder 404. The temporary freezing of updates as indicated above accomplishes that.

Figure 5:
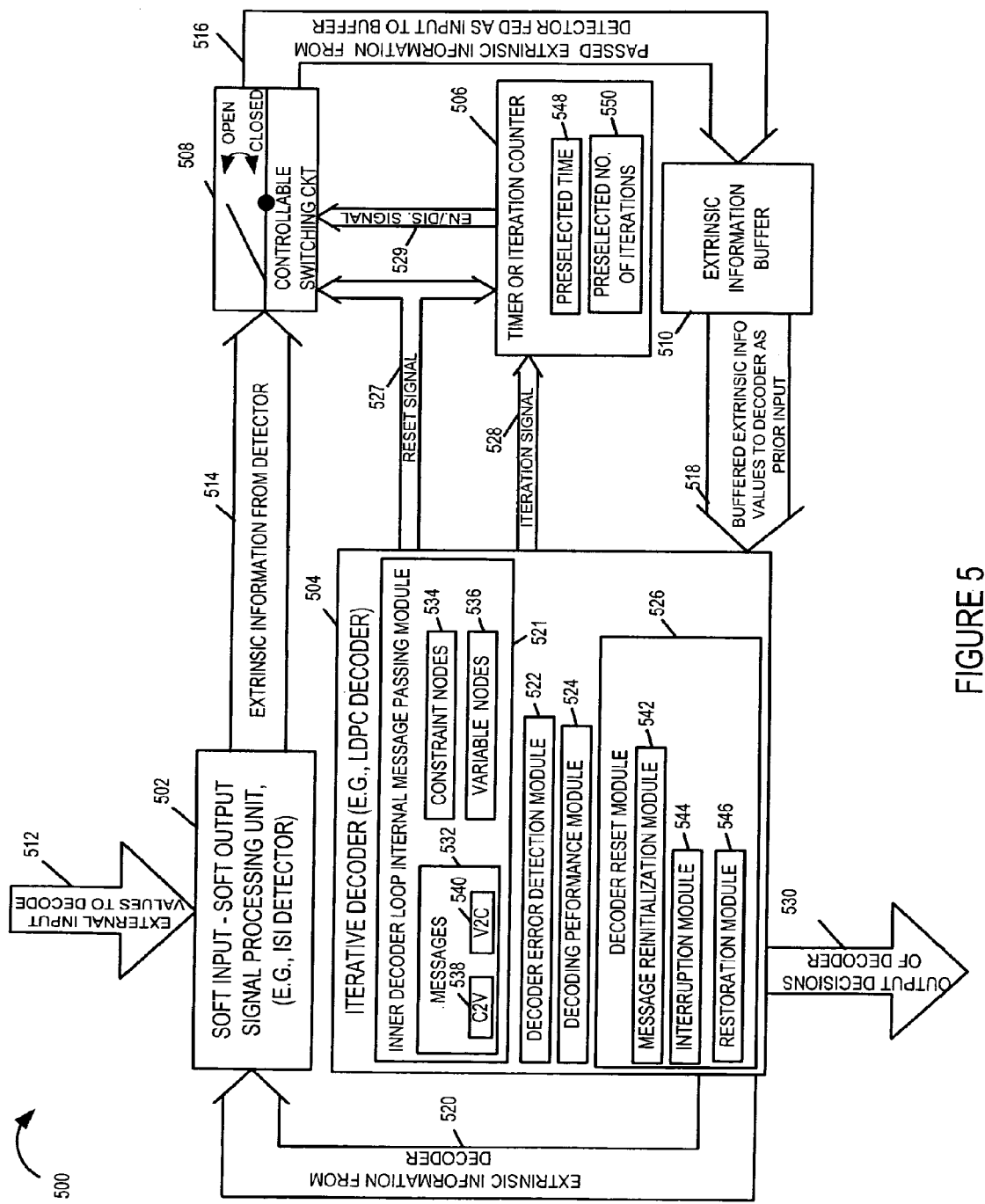
FIG. 5 is an another exemplary embodiment of an apparatus for performing decoding operations, said apparatus including an error floor reducing mechanism implemented in accordance with the present invention and using methods of the present invention.

FIG. 5 is a drawing 500 illustrating another exemplary apparatus for performing decoding operations, said apparatus including an error floor reducing mechanism implemented in accordance with the present invention and using methods of the present invention. Exemplary apparatus 500 includes a soft input-soft output signal processing unit, e.g., an ISI detector, 502, an iterative decoder, e.g., an LDPC or turbo decoder, 504, a timer or iteration counter 506, a controllable enable/disable switching circuit 508, and a soft information values buffer 510. Apparatus 500 includes an outer communication decoding loop and an inner decoding loop.

The outer communication decoding loop comprises the soft input-soft output signal processing unit 502, the controllable switching circuit 508, the extrinsic information values buffer 510, an the iterative decoder 504. The inner decoding loop, e.g., a message passing loop between constraint and variable nodes, is internal to the iterative decoder 504. External input values to be decoded 512, e.g., received signal received at the receiver including ISI, are input to the soft input-soft output signal processing unit 502. The soft input-soft output signal processing unit 502, using its knowledge of interfering symbols and the nature of the interference, generates and outputs soft extrinsic information values 514 which are input to the controllable switching circuit 508. Initially and during most of the decoding process the controllable switching circuit 508 is closed and the soft extrinsic information values 514 are forwarded as passed soft extrinsic information values 516 to the buffer 510 where the values are stored. The extrinsic information values buffer 510 forwards the stored information to the iterative decoder 504 as buffered soft extrinsic information values 518. The iterative decoder 504, e.g., an LDPC or turbo decoder, implemented in accordance with the invention, performs soft decoding, e.g., using a message passing method. Iterative decoder 504 includes an inner decoder loop internal message passing module 521. Module 521 includes messages 532, constraint nodes 534, and variable nodes 536. Module 521 passes c2v messages 538 from the constraint nodes 534 to the variable node 536 and v2c messages 540 from the variable nodes 536 to the constraint nodes 534 in an iterative manner as part of an iterative message passing decoding process. As part of the decoding process, extrinsic information 520, e.g., updated soft values which include reliability information, about the transmitted symbols is generated and output as extrinsic information from decoder 520. The extrinsic information from the decoder 520 is input to the soft input-soft output signal processing unit 502 as prior information on the transmitted symbols. The soft input-soft output signal processing unit 502 can use the received extrinsic information 520, sourced from the decoder 504, to improve the removal of ISI and generate new soft extrinsic information values 514. The new soft extrinsic information values 514, an improved estimate, is now passed through the switching circuit 508 and buffer 510 and supplied to the iterative decoder 504 as new buffered extrinsic information 518. This can result in improved decoding by the iterative decoder 504 and improve the new extrinsic information 520 being generated and forwarded toward the soft input-soft output signal processing unit 502 along the path previously described. This iterative process can continue; however, at some point a decoding error may be detected, the rate of performance increase may decrease below some threshold, a predetermined number of iterations may have been performed, the decoder may decide that performing further iterations without a reset would not be productive, and/or some other trigger mechanism may be invoked, starting a reinitialization process, in accordance with the invention.

The exemplary iterative decoder 504 includes a decoder error detection module 522, a decoding performance module 524, and a decoder reset module 526. The decoder error detection module 522 may detect failures, e.g., recognize that all parity checks are not satisfied when the decoder has attempted to find a bit assignment that satisfies all parity checks but has failed to do so, e.g., after a specified number of iterations. Such detected failure information may be forwarded to the decoder reset module 526. The decoding error performance module 524 may estimate decoding error performance, evaluate changes in performance, and/or rates of changes in performance and forward such information to the decoder reset module 526. The decoder reset module 526 uses information from the decoder error module 522 and the decoding error performance module 524 to make decisions as to the initiation of a decoder reset and the generation of a decoder reset. The decoder reset module 526 includes a message reinitialization module 542, an interruption module 544, and a restoration module 546. A decoder reset, when invoked includes a reinitialization of at least some of the edge messages 532, e.g., setting c2v (constraint to variable messages) 538 to 0 (and/or v2c messages 540) within the iterative decoder 504 memory for a given iteration, under the direction of the message reinitialization module 542. In some embodiments, v2c (variable to constraint) messages in decoder memory may also be cleared. At this time, it is advantageous to not update the soft extrinsic information values 518 being used by the iterative decoder 504 as prior information; therefore controllable switching circuit 508 is opened, under the control of the interruption module 544, e.g., for several iterations to allow the decoder 504 to at least partially re-converge, and the information stored in soft extrinsic information values buffer 510 remains fixed providing reasonable soft extrinsic information values 518 to the iterative decoder 504. When deemed appropriate, switch 508 is closed, under the direction of the restoration module 546 and/or the timer or iteration counter 506, completing the outer communications loop feedback path between the soft input-soft output signal processing unit 502 and decoder 504. Buffer 510 is updated with new passed extrinsic information values 516, which are forwarded to decoder 518 as new buffered soft extrinsic information values 518. The decoding process including a closed outer loop providing new buffered soft extrinsic information values to decoder 518 resumes, and, in many cases, a lower error floor is achieved by the decoder 504, than would have otherwise been possible without the message re-initialization in the decoder 504 and the temporary suspension of new feedback data into the decoder 504. At some point a decision is made by the decoder 504, e.g., based on a successfully decoded codeword, a number of iterations and/or an estimated value from the decoding performance module 524 to output the decisions of the decoder, e.g., the decoded information 530 with an associated probability.

As shown in FIG. 5, a simple controllable switching circuit 508 can be used to enable/disable the outer communications feedback loop. Various alternatives may be used to control the opening and closing of the switching circuit 508. For example, in some embodiments, the switching circuit 508 may be controlled by a timer or iteration counter 506. The point at which the switching circuit 508 is opened may be controlled by a reset signal 527 generated by the interruption module 544 of the iterative decoder 504 and sent to the timer or iteration counter 506 as part of a re-initialization process. In addition to the reset signal 527, the iterative decoder 504 may be responsible for generating an iteration or other timing signal 528 used to drive the timer or iteration counter 506. The timer or iteration counter 506 may include a pre-selected amount of iterative decoder processing time 548 and/or a pre-selected number of message passing decoder iterations 550 used for determining the length of the duration of the opening of the switch 508, when a reset is initiated. The reset signal 527 generated by the iterative decoder 504 may control the opening of the switching circuit 508 by triggering the timer or iteration counter 506 to generate an enable/disable signal 529 to cause the switching circuit 508 to open. Then, the timer or iteration counter 506 can hold the enable/disable signal 529 in the switch open state unit the preselected time 548 or preselected number of iterations 550 has been reached following opening of the switch, wherein the enable/disable signal is changed to a signal that causes the switching circuit 508 to close.

Alternatively, in some embodiments, the reset signal 527 generated by the interruption module 544 of the iterative decoder 504 may control the opening of the switching circuit 508 directly to cause the switching circuit to open, and the state of the reset signal 527 may be changed by the restoration module 546 of the iterative decoder 504 causing the switching circuit to close. In such an embodiment, any pre-selected amount of iterative decoder processing, e.g., any preselected amount of iterative decoder processing time or any pre-selected number of message passing decoder iterations used in the determination of the switch 508 opening and/or closing is internal to decoder 504.

FIG. 6 is a chart 600 used to better explain ideas and processes, in accordance with the invention, in the context of an exemplary coding performance curve that might be encountered in a system using an exemplary LDPC decoder. Two performance curves having different error floors are shown. The better, e.g., lower frame error rate, curve corresponds to a turbo equalized system employing an embodiment of the current invention while the other, higher frame error rate, curve corresponds to the same system without the current invention. Consider operating at 5.0 dB SNR. Consider first decoding without the current invention. At the beginning of the decoding process, the effective SNR seen by the exemplary decoder may correspond to operating point A 610 (about 3 dB) on curve 601. At this point the expected frame error rate of the decoder is about $2 \times 10^{-8}$. During the turbo equalization process the effective SNR seen by the decoder may improve to point C 614 or better (about 8.5 dB) with an expected frame error rate of about $5 \times 10^{-10}$. Nevertheless, without invoking the current invention, the actual frame error rate may not be significantly better than $5 \times 10^{-9}$ as indicated by point B 612. This is because the decoder may get trapped in a failure mode early in the decoding process and it is not dislodged as the input to the decoder improves. Consider now decoding with the current invention. Reinitializing the decoder in accordance with the invention after the effective SNR seen by the decoder improves to 8.5 dB, while temporarily freezing the extrinsic information, e.g., soft information values, provided to the decoder, can allow the decoder to perform as if operating at point C 614 with a frame error rate of about $5 \times 10^{-10}$ (at about 8.5 dB).

This may occur even though the system is nominally operating at point B. As a consequence the performance curve at point B now reaches the performance of point C and we thus obtain the apparent performance indicated by point D.

Among other things, the present invention is directed to a turbo equalized iterative decoder system in which the decoder edge state is reinitialized or cleared if decoding has not converged after several iterations, e.g., a pre-selected number of iterations or a dynamically determined number of iterations, with further iterations being performed after a re-initialization process in accordance with the present invention. In addition, in accordance with one feature of the present invention, when decoder re-initialization is performed as part of an ongoing decoding operation, the feedback loop between the detector and the decoder is temporarily cut or opened, e.g., to maintain the quality of the decoder input. This operation may also be performed after one or sufficiently many iterations, e.g., a pre-selected number of message passing decoding iterations, regardless of whether convergence is detected or not, but this is not the preferred embodiment.

A message passing iteration in the context of an LDPC decoder may represent, e.g., the passing of a set of messages as part of a variable to check node processing operation and the subsequent passing of messages from the check node processing element back to the element performing variable node processing operations.

FIG. 7 is a flowchart 700 illustrating an exemplary method of decoding data input to be decoded in accordance with an exemplary embodiment of the present invention. FIG. 7 comprises the combination of FIGS. 7A, 7B, 7C, and 7D.

The exemplary decoding method starts at step 702. Operation proceeds to step 704, where the decoder system is initialized. In step 704 the various components of the decoder system, e.g., iterative decoder, signal processing unit, buffers, counter, etc., may be powered on and cleared and/or reset. Operation proceeds from step 704 to step 706. In step 706, a soft input-soft output (SISO) signal processing unit, e.g., an intersymbol interference (ISI) detector is operated to receive input data to be decoded 705, e.g., a set of external input values to be decoded. Next, in step 708, the SISO signal processing unit is operated to generate soft information values, e.g. posterior or extrinsic information values, from the input data 705. Then in step 710, the SISO signal processing unit is operated to output the generated soft information values toward an iterative decoder, e.g., an LDPC encoder which performs LDPC decoding operations. In other embodiments, the iterative decoder may be a different type of iterative decoder, e.g., a turbo decoder which performs turbo product decoding operations. Operation proceeds from step 710 to step 712.

In step 712, the iterative decoder is operated to perform message passing decoder operations using an inner message passing decoder loop. Step 712 includes sub-steps 714, 716, 718, 720, 722, 724, and 726. In sub-step 714, the inner message passing decoder loop of the iterative decoder is operated to receive the soft information values, e.g. as prior information values. Then, in sub-step 716, the iterative decoder is operated to generate variable node to check node messages, and in sub-step 718 the iterative decoder stores the variable node to check node messages in memory. Operation proceeds from sub-step 718 to sub-step 720. In sub-step 720, the iterative decoder is operated to generate check node to variable node messages, and in sub-step 722 the iterative decoder stores the check node to variable node messages in memory. Operation proceeds from sub-step 722 to sub-step 724. In sub-step 724, the inner message passing loop of the iterative decoder is operated to generate extrinsic information used by said SISO signal processing unit, and in sub-step 726, the inner message passing loop of the iterative decoder outputs the generated extrinsic information 727 toward the SISO signal processing unit. A single message passing decoder iteration is shown in step 712. It should be appreciated that steps 716 through 722 may be performed iteratively several times before proceeding to step 724.

Operation proceeds from step 712 via connecting node A 728 to step 730. In step 730, the SISO signal processing unit is operated to receive the extrinsic information 727 from the iterative decoder and the input data to be decoded 705, e.g., the set of external input values to be decoded. In some embodiments, the SISO signal processing unit has retained, e.g., in its memory, the set of external values to be decoded, previously received in step 706, and accesses those values during step 730. Operation proceeds from step 730 to step 732. In step 732, the SISO signal processing unit is operated to generate soft extrinsic information values from the input data 705 as a function of the extrinsic information 727 received from the iterative decoder. For example, the SISO signal processing unit, e.g., an ISI detector may perform an ISI detection operation and generate soft extrinsic information values as output from that operation. Operation proceeds from step 732 to step 734.

In step 734, the iterative decoder is operated to perform message passing decoder operations using the inner message passing decoder loop. Step 734 includes sub-steps 736, 738, 740, 742, 744, 746, and 748. In sub-step 736, the inner message passing decoder loop of the iterative decoder is operated to receive the soft extrinsic information values. Then, in sub-step 738, the iterative decoder is operated to generate variable node to check node messages, and in sub-step 740 the iterative decoder stores the variable node to check node messages in memory. Operation proceeds from sub-step 740 to sub-step 742. In sub-step 742, the iterative decoder is operated to generate check node to variable node messages, and in sub-step 744 the iterative decoder stores the check node to variable node messages in memory. Operation proceeds from sub-step 744 to sub-step 746. It should be appreciated that steps 738 through 744 may, and in several embodiments are, performed multiple times in an iterative fashion before proceeding to step 746. In sub-step 746, the inner message passing loop of the iterative decoder is operated to generate new extrinsic information used by said SISO signal processing unit, and in sub-step 748, the inner message passing loop of the iterative decoder outputs the generated new extrinsic information 727 toward the SISO signal processing unit.

Operation proceeds from step 734 to step 750, in which monitoring to determine the current status of a preselected decoding condition is performed. For example, exemplary decoding conditions may include a decoding result generated by the iterative decoder failing to converge to a known codeword within a pre-selected amount of time or within a predetermined number of iterative decoder message passing iterations, and/or the detection of a successfully decoded codeword. Then, in step 752, operation proceeds based on whether or not the current detected decoding condition matches a condition used for triggering a means for interrupting an outer communication in an outer communications loop between the decoder and the SISO signal processing unit has been detected in step 750.

If the decoding condition used for triggering the interruption has not been detected, then operation proceeds from step 750 to step 753. In step 753 a check is performed as to whether or not the codeword was successfully decoded. Successful decoding may be determined by checking to see if all parity constraints have been satisfied, e.g., indicating convergence to a valid codeword. If the codeword was successfully decoded, operation proceeds via connecting node F 755 to step 792; otherwise operation proceeds to step 754. In step 754 the decoder continues decoding operations with a closed outer communications loop and operations proceed from step 754 back to step 730.

However, if the decoding condition used for triggering the interruption has been detected in step 750, then operation proceeds from step 752 via connecting node B 756 to step 758.

In step 758, communications in the outer communications loop including the SISO signal processing unit and the iterative decoder are interrupted by stopping at least one of i) extrinsic information from the SISO signal processing unit to said iterative decoder and ii) soft extrinsic information values from said SISO signal processing unit to said iterative decoder. Two alternative exemplary methods of performing step 758 are illustrated, e.g., for different alternative decoding system implementations. Sub-steps 760 and 762 may be used when the outer communication loop is interrupted at a point between the extrinsic information output of the iterative decoder and the prior information input of the SISO signal processing unit. Alternatively, sub-steps 764 and 766 may be used when the outer communications loop is interrupted between the extrinsic information output of the SISO signal processing unit and the prior information input of the iterative decoder.

In sub-step 760, a switch positioned between the extrinsic information output of said iterative decoder and a prior information input of said SISO signal processing unit is opened. Then, in sub-step 762, an extrinsic information buffer included in said outer communications loop is operated to store said extrinsic information while said outer loop is interrupted. For example, the switch may be a controllable switch in series with the extrinsic information buffer. While the outer loop is closed updated extrinsic information passes through the switch and the buffer and is forwarded to the SISO signal processing unit; however, when the switch is opened, the information in the buffer is temporarily frozen. The frozen extrinsic information is available to the input of the SISO signal processing unit while the outer communications loop remains open.

In sub-step 764, a switch positioned between a extrinsic information output of said SISO signal processing unit and a prior information input of said iterative decoder is opened. Then in sub-step 766, an extrinsic information buffer coupling an output of said switch to a prior information input of said iterative decoder is operated to store said extrinsic information while said outer communications loop is interrupted. For example, the switch of step 764 may be a controllable switch in series with the soft information values buffer. While the outer loop is closed soft information values pass through the switch and the buffer and are forwarded to the iterative decoder; however, when the switch is opened, the information in the buffer is temporarily frozen. The frozen soft information values are available to the input of the iterative decoder while the outer communications loop remains open.

The switch of sub-step 760 or 762 may be, e.g., a controllable switch included as part of a controllable switching circuit. In some embodiments, a control signal to open the switch may be sent directly from the iterative decoder to the switch. In some embodiments, the iterative decoder may send timing signals and/or switch control signals to a timer or iteration count which in turn generates the control signal to the controllable switch to open the outer communications loop.

Operation proceeds from step 758 to step 768. In step 768, the iterative decoder is operated to re-initialize at least some messages communicated in said inner message passing decoder loop which are used by said iterative decoder prior to successful decoding of said set of input data values. Step 768, includes sub-step 770. In sub-step 770, the iterative decoder is operated to reset at least some of the messages used in the decoding process. Sub step 770 includes sub-steps 772 and 774. In step 772, the iterative decoder is operated to clear at least a portion of the memory used to store check node to variable node messages, e.g., for one iteration, and in step 774 the iterative decoder is operated to clear at least a portion of the memory used to store variable node to check node messages, e.g., for one iteration. In some embodiments, stored check node to variable node messages are cleared, while variable node to check node messages are not cleared. In some embodiments, each of the stored check node to variable node messages are cleared. Operation proceeds from step 768 to step 776. In step 776, the iterative decoder is operated to continue said decoding of said set of input data values using said re-initialized messages, e.g., the iterative decoder inner decoder loop continues its message passing operations, even though the outer communications loop is open. The re-initialized messages have effectively reset the iterative decoder; however, now the iterative decoder restarts with better quality prior information inputs than was the case in step 712. Operation proceeds from step 776 via connecting node C 778 to step 780.

In step 780, decoding system components, e.g., the iterative decoder and/or the timer or iteration counter either alone or in combination, determine the amount of iterative decoder processing, e.g., the number of message passing decoder iterations or decoder processing time, since communications in the outer communications loop were interrupted. Then, in step 782, a comparison is made between the determined amount of iterative decoder processing and a pre-selected amount of iterative decoder processing, e.g., a pre-selected number of message passing decoder iterations or a predetermined amount of iterative decoder processing time. Operation proceeds from step 782 to step 784.

In step 784, a check is made as to whether or not the pre-selected amount of iterative decoder processing has occurred since the outer communications loop was opened. If the pre-selected amount of processing has not yet occurred, then operation proceeds form step 784 to step 786. In step 786, decoding operations are continued with an open outer communications loop and operations proceed back to step 780.

However, if the pre-selected amount of iterative decoder processing had occurred, operation proceeds from step 784 to step 788. In step 788, the interrupted communication in the outer communication loop are restored, e.g., the switch is closed and the buffer is allowed to receive and forward new information. Closing of the switch may be performed by signaling from the iterative decoder and/or the timer or iteration counter. Operation proceeds from step 788 to step 790, where the iterative decoder and the signal processing unit are operated to continue with decoding operations with a closed outer communications loop.

At some point, e.g., after a specified number of additional message passing iterations, after a specified amount of additional time, after a certain estimated quality level has been reached, and/or based on an external event, e.g., the need for the decoded data, operation proceeds to step 792. In step 792, the iterative decoder outputs decisions, e.g., decoded values of the external input data 705 and, in some embodiments, corresponding associated probability information. From step 792, operation proceeds to step 794.

In step 794, a check is performed as to whether there is an additional set of input values to be decoded. If there is another set of input values to be decoded, operation proceeds from step 794 via connecting node E 796 to step 704. However, if there are no additional sets of input data to be decoded, then operation proceeds to end step 798.

The above-described methods may be implemented in a computer system that includes memory, a CPU and one or more input and/or output devices coupled together. In such an implementation, the memory includes a routine implemented in accordance with the invention for controlling the processor (CPU) to perform decoding and other operations including re-initialization operations in accordance with the present invention. In some embodiments, routines, hardware and/or a combination of hardware and software are provided to control the processor to implement the operations performed by each of the modules/elements shown in FIG. 4 or 5. When executed, the routines cause the CPU to receive, process, and output data in accordance with the present invention thereby implementing one or more of the operations performed by the elements shown in FIG. 4 or 5 under software control.

Alternatively, the steps of the present invention may be implemented using dedicated hardware, e.g., circuits and/or a combination of hardware and software.

What is claimed is:

1. An apparatus for performing decoding operations, said apparatus comprising:
a soft input-soft output signal processing unit for processing input values to be decoded, said soft input-soft output signal processing unit including a feedback information input for receiving feedback information and an information value output for outputting information values generated by said soft input-soft output signal processing unit;
an iterative decoder for performing message passing decoder operations using an internal message passing decoder loop, said iterative decoder having an information value input and a feedback information output, said information value input being coupled to said information value output of said soft input-soft output signal processing unit, said feedback information output being coupled to said feedback information input of said soft input-soft output signal processing unit; and
a decoder error detection module coupled to the iterative decoder for determining if a codeword has been successfully decoded and operable to command said iterative decoder to re-initialize.

2. The apparatus of claim 1 wherein the iterative decoder is operable to reinitialize a plurality of edge states when commanded by the decoder error detection module.

3. The apparatus of claim 1 wherein the decoder error detection module is operable to count a predetermined number of iterations from the start of decoding of a set of input values and if a codeword is not successfully decoded after the predetermined number of iterations commanding the iterative decoder to reinitialize.

4. The apparatus of claim 1 further comprising a switch coupled to said iterative decoder and said soft input-soft output signal processing unit for temporarily freezing feedback information from said iterative decoder to said soft input-soft output signal processing unit.

5. The apparatus of claim 4 further comprising a timer coupled to the switch for controlling operation of the switch.

6. An apparatus for performing decoding operations, said apparatus comprising:
means for processing input values to be decoded including a feedback information input for receiving feedback information and an information value output for outputting information values generated by said soft input-soft output signal processing unit;
means for performing message passing decoder operations using an internal message passing decoder loop, said message passing decoder means having an information value input and a feedback information output, said information value input being coupled to said information value output of said means for processing input values, said feedback information output being coupled to said feedback information input of said means for processing input values;

means for determining if a codeword has been successfully decoded and commanding said means for performing message passing decoder operations to re-initialize.

7. The apparatus of claim 6 wherein the means for performing message passing decoder operations is operable to reinitialize a plurality of edge states when commanded by the decoder error detection module.

8. The apparatus of claim 6 wherein the means for determining if a codeword has been successfully decoded is operable to count a predetermined number of iterations from the start of decoding of a set of input values and if a codeword is not successfully decoded after the predetermined number of iterations commanding the iterative decoder to reinitialize.

9. The apparatus of claim 6 further comprising means for temporarily freezing feedback information.

10. The apparatus of claim 9 further comprising means for controlling operation of the switch.

11. A method for performing decoding operations, said method comprising:

processing input values to be decoded using a feedback information input and outputting information values;

performing message passing decoder operations using an internal message passing decoder loop using the information value input and producing feedback for the feedback information input;

determining if a codeword has been successfully decoded and reinitializing an iterative decoder.

12. The apparatus of claim 11 wherein the step of performing message passing decoder operations further comprises reinitializing a plurality of edge states.

13. The apparatus of claim 11 wherein the step for determining if a codeword has been successfully decoded further comprises counting a predetermined number of iterations from the start of decoding of a set of input values and if a codeword is not successfully decoded after the predetermined number of iterations commanding the iterative decoder to reinitialize.

14. The apparatus of claim 11 further comprising temporarily freezing feedback information using a switch.

15. The apparatus of claim 14 further comprising controlling operation of the switch.

16. A memory having a routine for controlling a processor to perform the following operations:

processing input values to be decoded using a feedback information input and outputting information values;

performing message passing decoder operations using an internal message passing decoder loop using the information value input and producing feedback for the feedback information input;

determining if a codeword has been successfully decoded and reinitializing an iterative decoder.

17. The memory of claim 16 wherein the instructions for performing message passing decoder operations further comprise instructions for reinitializing a plurality of edge states.

18. The memory of claim 16 wherein the instructions for determining if a codeword has been successfully decoded further comprises instructions for counting a predetermined number of iterations from the start of decoding of a set of input values and if a codeword is not successfully decoded after the predetermined number of iterations commanding the iterative decoder to reinitialize.

19. The memory of claim 16 further comprising instructions for temporarily freezing feedback information using a switch.

20. The memory of claim 19 further comprising instructions for controlling operation of the switch.

* * * * *